United States Patent [19]

Lewis

[11] Patent Number: 4,471,340
[45] Date of Patent: Sep. 11, 1984

[54] ANALOG TO DIGITAL CONVERTER

[75] Inventor: Bernard L. Lewis, Oxon Hill, Md.

[73] Assignee: The United States of America as represented by the Secretary of the Navy, Washington, D.C.

[21] Appl. No.: 269,455

[22] Filed: Jun. 2, 1981

[51] Int. Cl.$^3$ ............................................. H03K 13/02
[52] U.S. Cl. ......................... 340/347 AD; 340/347 CC
[58] Field of Search ................. 340/347 AD, 347 CC; 324/78 D, 83 D, 82, 99 D; 332/1

[56] References Cited

U.S. PATENT DOCUMENTS

| | | | |
|---|---|---|---|
| 3,007,149 | 10/1961 | Brown | 340/347 AD |
| 3,189,820 | 6/1965 | Lowman | 324/82 |
| 3,521,269 | 7/1970 | Brooks et al. | 340/347 AD |
| 3,533,101 | 10/1970 | Lauchner et al. | 340/347 AD |
| 3,613,067 | 10/1971 | Haberle | 340/347 AD |
| 3,617,900 | 11/1971 | Fink | 324/82 |
| 3,710,376 | 1/1973 | Fluegel | 340/347 CC |
| 3,737,891 | 6/1973 | Metcalf | 340/347 CC |
| 3,745,559 | 7/1973 | Mattern . | |
| 4,188,628 | 2/1980 | Langeraar | 324/83 D |

Primary Examiner—C. D. Miller
Attorney, Agent, or Firm—Robert F. Beers; William T. Ellis; Alan P. Klein

[57] ABSTRACT

A device for converting a signal voltage into a multi-bit digital word that defines the voltage magnitude and polarity. The input voltage V to be digitized is used to control the frequency of a voltage controlled oscillator, whose output is defined to be $f=f_o+kV$. The signal out of the voltage controlled oscillator is fed to differential delay line filters that permit all digits to be derived in parallel. The filters comprise pairs of delay lines of unequal length, each pair feeding a respective phase detector whose output is amplified, and diode-rectified and limited. To increase the accuracy of this device, an automatic frequency control loop can be incorporated to control $f_o$. This loop zeros V occasionally and reads the output digital word to measure the frequency error and add a correcting voltage to the input voltage V when it is not zeroed for the measurement.

4 Claims, 7 Drawing Figures

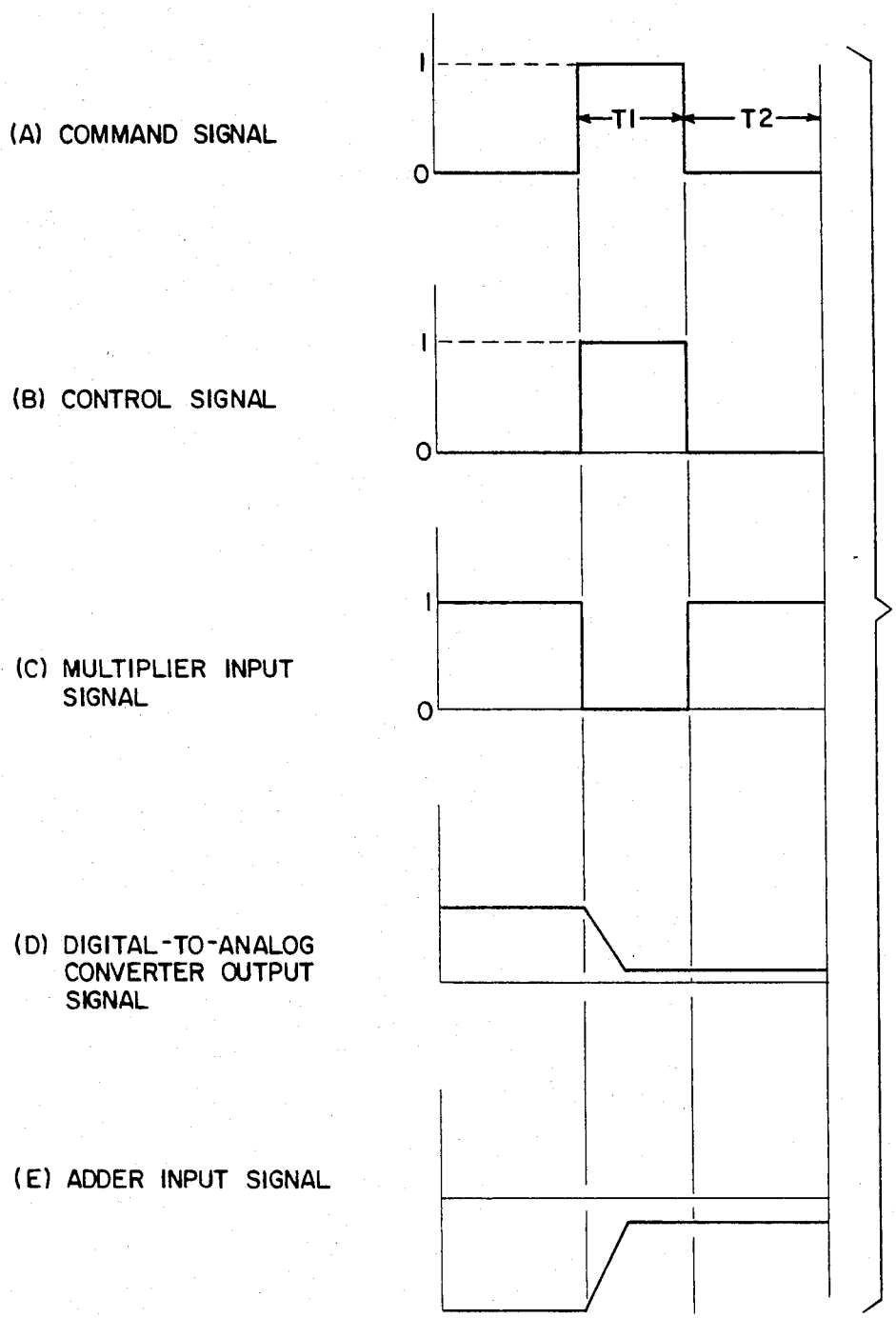

ANALOG TO DIGITAL CONVERTER

BACKGROUND OF THE INVENTION

This invention relates to analog to digital converters utilizing frequency variations of a signal to indicate analog quantities.

Old methods of converting from analog voltage to digital format are complex and speed or accuracy limited. Available devices normally compare the input voltage to a set of reference voltages and serially process the differences to develop the individual bits of the digital word that represents the signal voltage. This serial process takes time and limits the rate at which new words can be generated to follow changes in the signal voltage with time. However, the article "High Speed Electro-Optic Analog-to-Digital (A/D) Converter," SPIE Vol. 176, Guided Wave Optical Systems and Devices 11 (1979) pp 28–35 discloses a new device which employs optical components with voltage variable delay lines to parallel process the individual bits. This device can operate at very high speeds but is limited by optical power handling ability to four bit word accuracy.

SUMMARY OF THE INVENTION

Accordingly, it is an object of the present invention to convert an analog voltage into a multi-bit digital word that defines the voltage magnitude and polarity.

Another object is to convert an analog signal to digital words with high accuracy and speed.

A further object is to convert a signal voltage into a multi-bit digital word not limited to four bit word accuracy.

These and other objects of the present invention are achieved by an analog to digital converter including an input means for receiving an analog voltage-varying input signal whose instantaneous voltage V is to be converted to a digital value. A voltage-controlled oscillator is connected to the input means for generating a frequency-varying signal whose frequency f varies with V according to the relation $f=f_o+kV$, where $f_o$ is the center frequency of the oscillator and k is a constant. A digitizer means is connected to the voltage-controlled oscillator for generating digital output signals corresponding to changes in the voltage V of the analog input signal by increments which are submultiples of $\pm V_{max}=(f_o/2kn)$, where n is an integer. The digital output signals are coded in accordance with the voltage increments of the analog input signal, $V_{max}$ being the maximum voltage range unambigiously representable. The digitizer means is also connected to the input means for generating a digital output signal corresponding to the polarity of the voltage of the analog input signal.

Advantages of this invention over the old methods are its speed, accuracy, few active elements, and simplicity. Significant features are the conversion from voltage to frequency and use of differential length delay line pairs that permit all digits to be derived in parallel. Another advantage is that this device does not have to be preceded by a fast, accurate, analog sample-and-hold circuit.

Additional advantages and features will be come apparent as the subject invention becomes better understood by reference to the following detailed description when considered in conjunction with the accompanying drawings wherein:

BRIEF DESCRIPTION OF THE DRAWINGS

FIGS. 7(a)–7(e) are a series of waveforms produced at various points in the block diagram of FIG. 6.

DETAILED DESCRIPTION OF THE INVENTION

Figure 1:
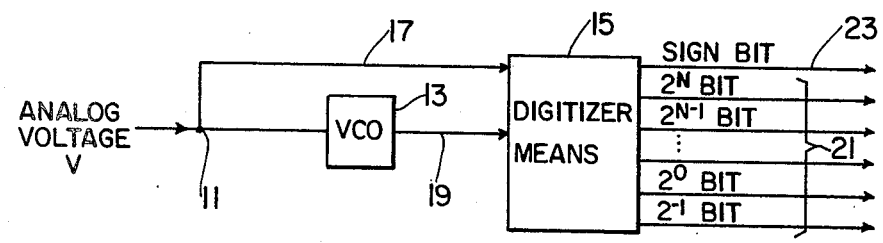
FIG. 1 is a block diagram of a first embodiment of the analog to digital converter of this invention.
Figure 3:
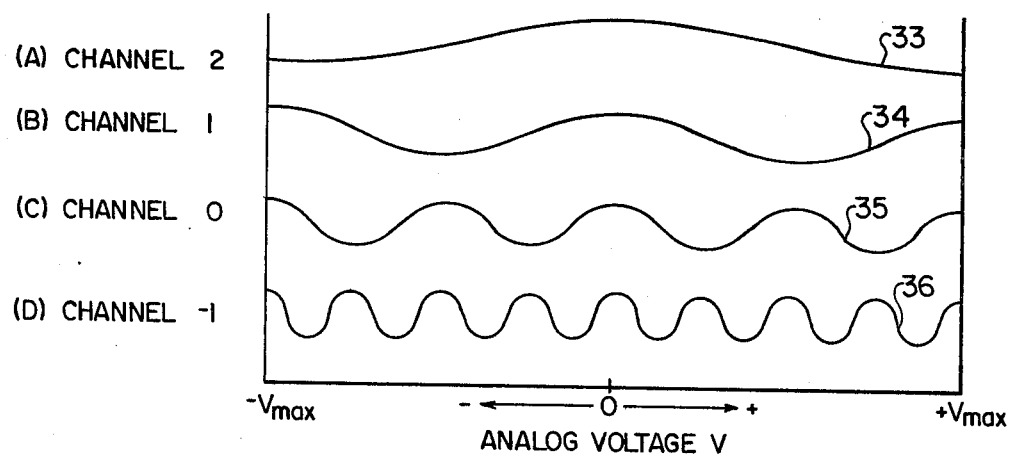
FIGS. 3(a)–3(d) show waveforms represented in a simplified but exemplary operation of the digitizer means of FIG. 2.

Referring now to the drawings, wherein like reference numerals designate identical or corresponding parts, and more particularly to FIG. 1, there is shown a first illustrative embodiment of the analog to digital converter of the present invention. The analog to digital converter includes an input means, i.e., node 11; a voltage-controlled oscillator 13 whose control input is connected to the input means; and a digitizer means 15 which is connected by way of lines 17 and 19 to the input means and to the voltage controlled oscillator respectively.

In operation, the input means 11 receives an analog voltage-varying input signal whose instantaneous voltage V is to be converted to a digital value. The voltage-controlled oscillator 13 responds to the input signal by generating on line 19 a frequency-varying signal whose frequency f varies with V according to the relation $f=f_o+kV$, where $f_o$ is the center frequency of the voltage controlled oscillator and k is a constant. The digitizer means 15 responds to the frequency-varying signal by generating on lines 21 digital output signals corresponding to changes in the voltage V of the analog input signal by increments which are submultiples of the quantity $\pm V_{max}=f_o/2kn$, where n is an integer whose value is a matter of design choice. The digital output signals are coded in accordance with the voltage increments of the analog input signal; $V_{max}$ is the maximum voltage range which can be represented unambiguously. The digitizer means 15 responds to the input signal by generating on line 23 a digital output signal corresponding to the polarity of V.

Figure 2:
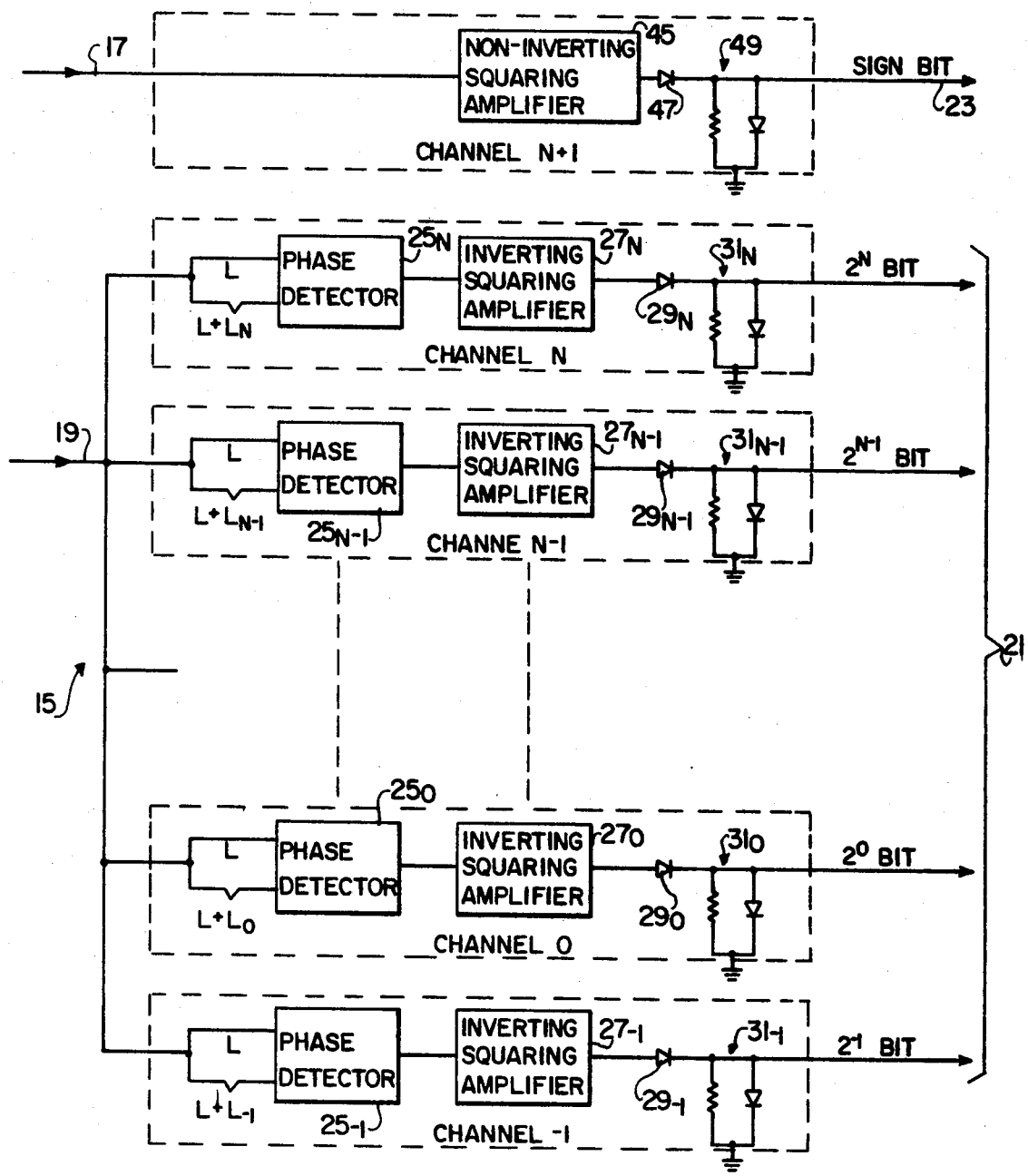
FIG. 2 is a schematic circuit diagram of the digitizer means.
Figure 4:
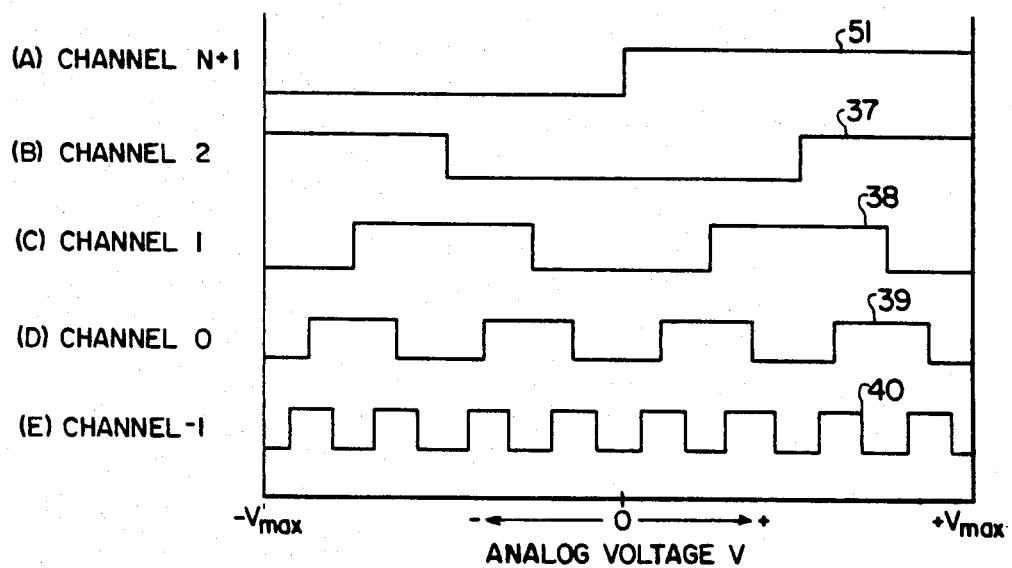
FIGS. 4(a)–4(e) show waveforms represented in the samplified but exemplary operation of the digitizer means of FIG. 2.
Figure 5:
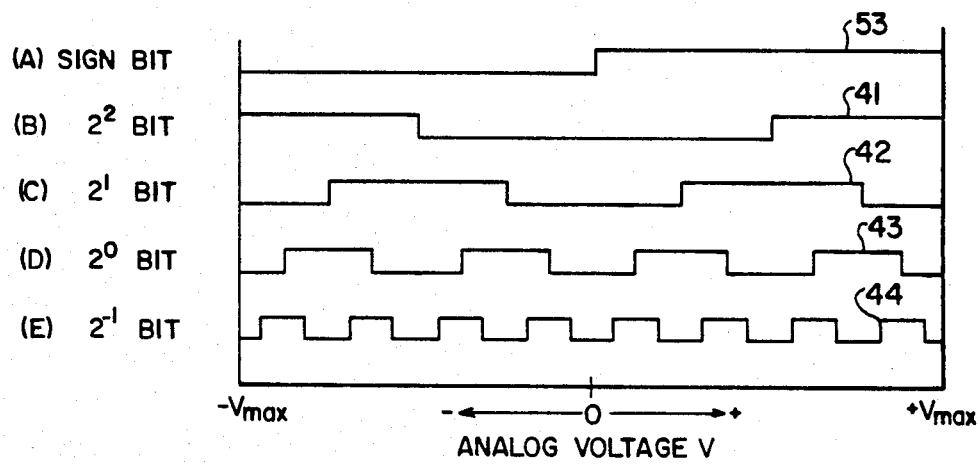
FIGS. 5(a)–5(e) show related binary information represented in the simplified but exemplary operation of the digitizer means of FIG. 2.

FIG. 2 is a schematic of the digitizer means 15 employed in the embodiment of FIG. 1 of the analog to digital converter. The digitizer means 15 includes a plurality of channels N, N−1, ..., 0, −1, each of which consists of a frequency-to-amplitude converter connected to a pulse-forming means.

In preference to any other form of frequency-to-amplitude converter, the invention employs in each channel a frequency-to-amplitude converter in the nature of a phase detector, e.g. $25_N$, having two inputs; and a pair of delay lines, e.g. L and $L+L_N$, having unequal lengths, one end of each of the delay lines being connected by way of the 19 to the output of the voltage controlled oscillator 13, and the other end of each of the delay lines being connected to a respective input of the phase detector. The difference in lengths of the pairs of delay lines in each of the channels N, N−1, ..., 0, −1 is varied according to the powers of 2. Specifically, the length difference in channel N is $L_N = c/2k|V_{Max}|$, where c is the speed of light; the length difference in channel N−1 is $L_{N-1} = 2L_N$; the length difference in channel N−2 is $L_{N-2} = (2)^2 L_N = 4L_N$, etc.

While a variety of pulse-forming means may be provided, such means may conveniently take the form illustrated in FIG. 2 of an inverting amplifier, e.g. $27_N$, connected to the output of the corresponding phase detector; a rectifier, e.g. $29_N$, connected to the output of the amplifier; and a diode limiter, e.g. $31_N$, connected to the output of the rectifier. The coded digital output signal is supplied over lines 21 from the diode limiters in each of the channels N, N−1, ..., 0, −1.

For purposes of explanation, let it be assumed that the digitizer means has only 4 channels (i.e., N=4 in FIG. 2), the four channels providing a four digit position binary output having a $2^2$ digit position for channel 2, a $2^1$ digit position for channel 1, a $2^0$ digit position for channel 0, and a $2^{-1}$ digit position for channel −1. When the frequency-varying signal from the voltage-controlled oscillator 13 is applied on line 19 to the plurality of frequency-to-amplitude converters, they respond by generating respective periodic, bipolar, amplitude-varying signals. The four sinusoidal waveforms 33–36 of FIGS. 3(a)–3(d) represent the output signals of the phase detectors $25_2$, $25_1$, $25_0$, $25_{-1}$ when the output of the voltage-controlled oscillator 13 is applied to the pairs of delay lines. As shown, the frequencies of the waveforms 33–36 in the respective channels vary according to the powers of 2. The pulse-forming means in each channel responds to the reversals in polarity of the output signal from the respective frequency-to-amplitude converter by generating digital output signals corresponding to the polarity reversals. That is, amplifiers $27_2$, $27_1$, $27_0$, $27_{-1}$ convert waves 33–36 into rectangular waves 37–40 (FIGS. 4(b)–4(e)) which reverse polarity exactly at the zero crossings of the sinusoidal waves 33–36. The rectifiers $29_2$, $29_1$, $29_0$, $29_{-1}$ cut off the negative halves of the waveforms 37–40 and the diode limiters $31_2$, $31_1$, $31_0$, $31_{-1}$ limit the positive half of the waveforms 37–40 to a value equal to the energy gap of the diode (0.3 volts for germanium and 0.6 volts for silicon diodes). The four rectangular waveforms 41–44 of FIGS. 5(b)–5(e) represent the output signals of the diode limiters $31_2$, $31_1$, $31_0$, $31_{-1}$. These waveforms, 41–44 constitute the digital output signals of the respective channels.

It should be noted that the polarity reversals or zero axis crossings of each of the signals supplied from the respective phase detectors (FIGS. 3(a)–3(d)) and of the resulting digital output signals (FIGS. 5(b)–5(e)) are intermediate to the zero axis crossing of all other supplied output signals. Such characteristic is utilized to represent digital information in the form of a Gray code.

The Gray code representation of the digital signals in FIGS. 5(b)–5(e) is obtained by assigning binary ones to a positive polarity signal and binary zero to a null signal. In proceeding from V=0 to V=±$V_{max}$, it is seen that there is a count from a minimum of 0 (i.e.,0000) to a maximum of $4\frac{1}{2}$ (i.e., 1000) for four digit positions including the $2^{-1} = \frac{1}{2}$ digit position. Only one digit position, that is, one output digital signal, changes at a given instant, a characteristic of the Gray Code.

Referring again to FIG. 2, the digitizer means also includes another channel N+1 which consists of a pulse-forming means which generates a digital output signal corresponding to the polarity of the voltage of the analog input signal. While a variety of such pulse-forming means may be provided, conveniently it may take the form shown of a non-inverting amplifier 45 connected by way of line 17 to the input means 11; a rectifier 47 connected to the output of the amplifier; and a diode limiter 49 connected to the output of the rectifier. Amplifier 23 responds to the input signal by generating the rectangular wave 51 shown in FIG. 4(a) which reverses polarity exactly at V=0. The rectifier 47 cuts off the negative half of the waveform 51, and the diode limiter 49 limits the positive half of the waveform 51 to a value equal to the low voltage drop across the diode to provide the rectangular wave 53 shown in FIG. 5(a) which constitutes the digital output signal of channel N+1. The polarity of V is obtained by assigning a plus to a positive polarity digital output signal and a minus to a null digital output signal.

Assuming the voltage-controlled oscillator 13 responds to a voltage change much faster than the delay time corresponding to the difference in lengths $L_{-1}$ of the pair of delay lines in channel −1, the time required by the analog to digital converter to settle to an accurate digital output is $$T_{-1} \approx \frac{L_{-1}}{c} = \frac{2^{N+1} L_N}{c} = \frac{2^N}{k|V_{max}|}$$

Thus, the rate B at which the output of the analog to digital converter can be sampled is $$B = \frac{1}{T_{-1}} \approx \frac{k|V_{max}|}{2^N}.$$

Voltage-controlled oscillators controllable over a frequency range more than $(f_{max}-f_o)=k \cdot V_{max}=\pm 5 \times 10^9$Hz are commercially available from Frequency Sources Inc., Chelmsford, Mass., for example. With such devices, N+2=10 bit analog to digital converters can be made to operate at speeds B of $$B \approx 5 \times 10^9/2^8 \approx 20 \text{ MHz}$$

and, N+2=8 bit analog to digital converters can be made to operate at speeds B of $$B \approx 5 \times 10^9/2^6 \approx 80 \text{ MHz}.$$

Figure 6:
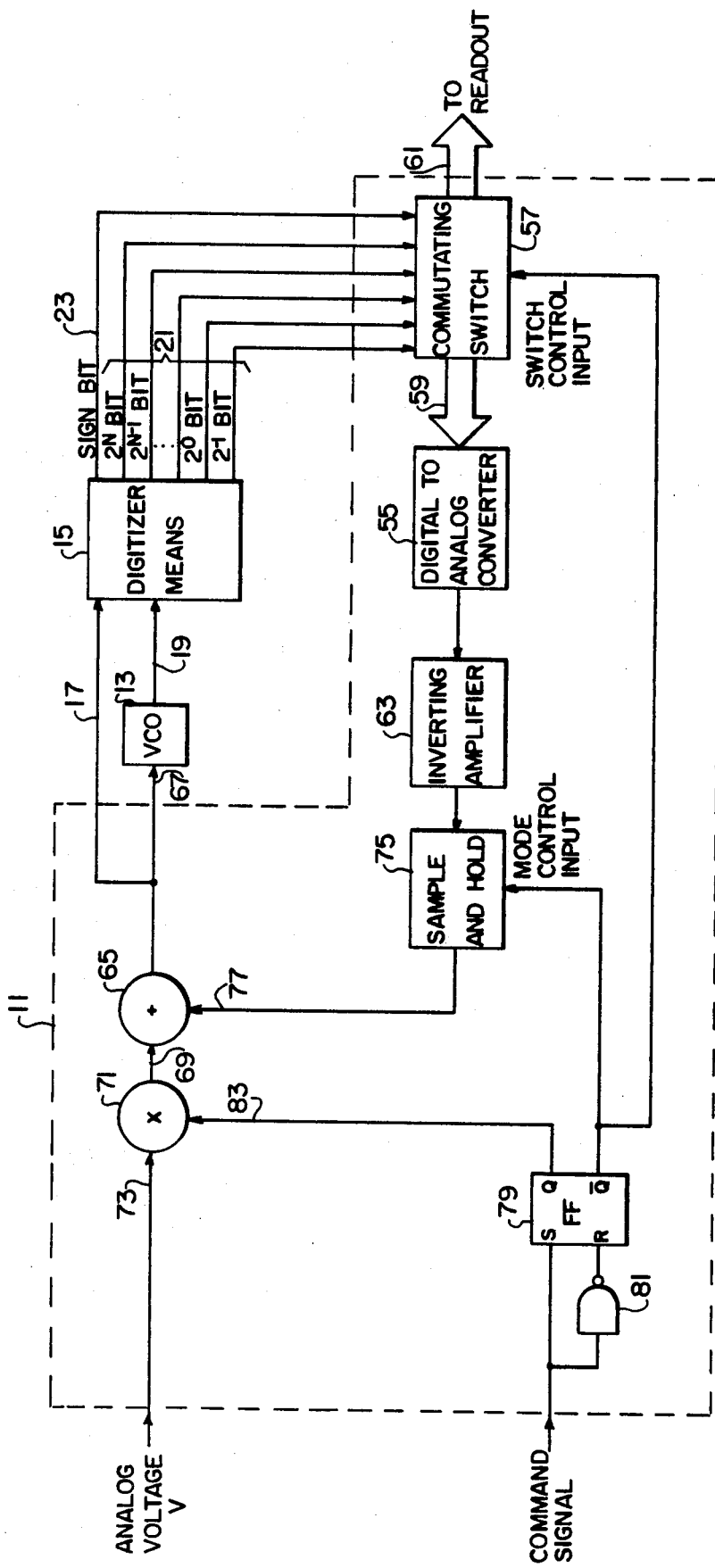
FIG. 6 is a block diagram of a second embodiment of the analog to digital converter of this invention.

FIG. 6 illustrates a modification of the device shown and described in FIGS. 1–4. This embodiment is useful when the frequency of the voltage-controlled oscillator 13 is unstable. The difference in the device of FIG. 6 from that of FIG. 1 is in the input means 11. An input means is employed in the nature of a means which produces an analog error signal that is a function of the error introduced into the digital output signals by drift in the frequency of the voltage-controlled oscillator; and a means connected to the error signal-producing means which sums the error signal with the analog voltage-varying input signal to supply an error-compensated input signal to the voltage-controlled oscillator to correct for the drift.

As shown in FIG. 6, the error signal-producing means may comprise, for example, a switch means, such as commutating switch 57, which can be cotnrolled by digital control signals applied to its switch control input to connect a digital to analog converter 55 by way of a bus 59 to the output lines 21, 23 of the digitizer means and to disconnect an external readout (not shown) from the output lines 21, 23 of the digitizer means 15; and alternatelyto disconnect the digital to analog converter 55 from the output lines 21, 23 of the digitizer means, and to connect the external readout by way of a bus 61 to the output lines 21, 23 of the digitizer means; the digital to analog converter 55; and an inverting amplifier 63 connected to the output of the digital to analog converter. The summing means may comprise, for example, a duel input adder 65 whose output feeds the voltage-controlled oscillator 13 by way of line 67 and one of whose inputs 69 is connected to the output of a dual input multiplier 71 having a first input 73 connected to receive the analog voltage-varying input signal whose instantaneous voltage V is to be converted to a digital value; a sample and hold circuit 75 connected between the output of the inverting amplifier 63 and the other input 77 of the adder and controlled by digital control signals applied to its mode control input; and a control means, such as an SR flip-flop 79 which has its R input connected to its S input by an inverter 81, its Q output connected to the second input 83 of the multiplier, and its $\overline{Q}$ output connected to the mode control input of the sample and hold circuit 75 and to the switch control input of the commutating switch 57.

Referring to FIGS. 7(a)-7(e), during a first time period T1 the flip-flop 79 is reset by the waveform shown in FIG. 7(a) causing the control signal whose waveform is shown in FIG. 7(b) to be transmitted to the commutating switch 57 and the sample and hold circuit 75, and inputting the waveform shown in FIG. 7(c) (logic zero) to the multiplier 71. In response, the commutating switch 57 connects the digital to analog converter 55 to, and disconnects the external readout from the output of the digitizer means 15, the sample and hold circuit 75 enters the sampling mode, and the multiplier 71 multiplies the analog voltage-varying input signal by 0 so that zero voltage is applied to the voltage-controlled oscillator 13. In the absence of the applied voltage, the voltage-controlled oscillator 13 applies to the digitizer means 15 a frequency which is offset from its center frequency $f_o$ by the drift to be corrected. The digitizer means 15 generates digital output signals corresponding to the equivalent voltage of the frequency drift which are inputted to the digital to analog connecter 55 by the commutating switch 57. The output of the digital to analog converter 55 whose waveform is shown in FIG. 7(d) is amplified and inverted in the amplifier 63, sampled by the sample and hold circuit 75 and fed to input 77 of the adder 65. The signal at the input 77 of the adder 65 whose waveform is shown in FIG. 7(e) changes the frequency of the voltage-controlled oscillator 13 in a manner to reduce the output of the digital to analog converter 55 to that of one $2^{31}$ 1 bit. That is, the frequency drift and its equivalent voltage are nulled. During a second time period T2, the flip-flop 79 is set by the wavform shown in FIG. 7(a) causing the control signal whose waveform is shown in FIG. 7(b) to be transmitted to the commutating switch 57 and the sample and hold circuit 75, and inputting the waveform shown in FIG. 7(c) (logic one) to the multiplier 71. In response, the commutating switch disconnects the digital-to-analog converter 55 from, and connects the external readout to, the output of the digitizer means 15; the sample and hold circuit 75 enters the hold mode; and the multiplier 71 multiples the analog voltage-varying input signal by 1 so that the full analog voltage-varying input signal is applied to the voltage-controlled oscillator 13. The sample and hold circuit 75 output remains at the voltage required to zero the frequency drift of the voltage-controlled oscillator 13 until the next time period for updating the voltage and the digitizer means 15 output is fed to the external readout.

Obviously, numerous modifications and variations of the present invention are possible in light of the above teachings. For example, the voltage controlled oscillator signals can be acoustic or electromagnetic (microwaves or optical) if the signal conductors, delay lines and power splitters are selected properly. It is therefore to be understood that within the scope of the appended claims, the invention may be practiced otherwise than as specifically described herein.

What is claimed as new and desired to be secured by Letters Patent of the United States is:

1. An analog to digital converter for converting an analog voltage-varying input signal into a coded digital signal comprising:
   input means for receiving an analog voltage-varying input signal, where V is the instantaneous value of the voltage;
   a voltage-controlled oscillator connected to the input means for generating a frequency-varying signal whose frequency f varies with V according to the relation $f=f_o+kV$, where $f_o$ is the center frequency of the oscillator and k is a constant;
   a plurality of frequency-to-amplitude converters connected to the output of the voltage-controlled oscillator, each frequency-to-amplitude converter responsive to the frequency-varying signal for generating a periodic bipolar amplitude-varying signal, each frequency-to-amplitude converter including,
   a phase detector having two inputs: and
   a pair of delay lines having unequal lengths, one end of each of the delay lines being connected to the voltage-controlled oscillator and the other end of each of the delay lines being connected to a respective input of the phase detector;
   a plurality of first pulse-forming means connected to respective frequency-to-amplitude converters and responsive to reversals in polarity of the output signal from the frequency-to-amplitude converters for generating digital output signals corresponding to the polarity reversals and,
   a second pulse-forming means connected to the input means for generating a digital output signal corresponding to the polarity of the voltage of the analog input signal.

2. An analog to digital converter for converting an analog voltage-varying input signal into a coded digital signal comprising:
   input means for receiving an analog voltage-varying input signal, where V is the instantaneous value of the voltage;
   a voltage-controlled oscillator connected to the input means for generating a frequency-varying signal whose frequency f varies with V according to the relation $f=f_o+kV$, where $f_o$ is the center frequency of the oscillator and k is a constant;
   a plurality of frequency-to-amplitude converters connected to the output of the voltage-controlled oscillator, each frequency-to-amplitude converter responsive to the frequency-varying signal for generating a periodic bipolar amplitude-varying signal, each frequency-to-amplitude converter including, a phase detector having two inputs; and a pair of delay lines having unequal lengths, one end of each of the delay lines being connected to the voltage-controlled oscillator and the other end of each of the delay lines being connected to a respective input of the phase detector;

a plurality of first pulse-forming means connected to respective frequency-to-amplitude converters and responsive to reversals in polarity of the output signal from the frequency-to-amplitude converters for generating digital output signals corresponding to the polarity reversals; and a second pulse-forming means connected to the input means for generating a digital output signal corresponding to the polarity of the voltage of the analog input signal, the second pulse-forming means including, a non-inverting amplifier;

a rectifier connected to the output of the amplifier; and a limiter connected to the output of the rectifier.

3. An analog to digital converter for converting an analog voltage-varying input signal into a coded digital signal comprising:

input means for receiving an analog voltage-varying input signal, where V is the instantaneous value of the voltage;

a voltage-controlled oscillator connected to the input means for generating a frequency-varying signal whose frequency f varies with V according to the relation $f = f_o + kV$, where $f_o$ is the center frequency of the oscillator and k is a constant; and digitizer means connected to the input means and to the voltage-controlled oscillator for generating digital output signals corresponding to incremental changes in the voltage V of the analog input signal, the digital output signals being coded in accordance with the voltage increments of the analog input signal, and for generating a digital output signal corresponding to the polarity of the voltage of the analog input signal, the input means including, a digital to analog converter;

controllable switching means for connecting and disconnecting the digital to analog converter to and from the output of the digitizer means;

an inverting amplifier connected to the output of the digital to analog converter;

a dual input adder;

a dual input multiplier having one input adapted to receive the analog voltage-varying input signal and an output connected to one input of the adder;

a controllable sample and hold circuit having an input connected to the output of the inverting amplifier and an output connected to the other input of the adder; and control means connected to the other input of the multiplier, to the sample and hold circuit and to the switching means for connecting the digital to analog converter to the output of the analog to digital converter, placing the sample and hold circuit in the sample mode, and inputting a zero to the multiplier during a first time period; and for disconnecting the digital to analog converter from the output of the analog to digital converter, placing the sample and hold circuit in the hold mode, and inputting a one to the multiplier during a second time period.

4. The analog to digital converter recited in claim 3 wherein the control means inlcudes:

a flip-flop.

* * * * *